US006528880B1

(12) United States Patent
Planey

(10) Patent No.: US 6,528,880 B1
(45) Date of Patent: Mar. 4, 2003

(54) SEMICONDUCTOR PACKAGE FOR POWER JFET HAVING COPPER PLATE FOR SOURCE AND RIBBON CONTACT FOR GATE

(75) Inventor: Bill Planey, Plano, TX (US)

(73) Assignee: Lovoltech Inc., Santa Clara, CA (US)

( * ) Notice: Subject to any disclaimer, the term of this patent is extended or adjusted under 35 U.S.C. 154(b) by 0 days.

(21) Appl. No.: 09/892,128

(22) Filed: Jun. 25, 2001

(51) Int. Cl.[7] .......................... H01L 23/48; H01L 23/52; H01L 29/40
(52) U.S. Cl. ...................... 257/735; 257/341; 257/666; 257/692; 257/736; 257/766
(58) Field of Search ................................. 257/735, 692, 257/666, 341, 736, 766

(56) References Cited

U.S. PATENT DOCUMENTS

| 4,700,461 A | * | 10/1987 | Choi et al. ................... 438/149 |
| 4,996,582 A | * | 2/1991 | Nagahama ................... 257/735 |
| 5,068,705 A | * | 11/1991 | Tran ............................ 257/273 |
| 5,218,231 A | * | 6/1993 | Kudo ........................... 257/735 |
| 5,266,834 A | * | 11/1993 | Nishi et al. .................. 257/706 |
| 5,665,996 A | * | 9/1997 | Williams et al. ............. 257/401 |
| 5,814,884 A | * | 9/1998 | Davis et al. ................. 257/723 |
| 6,040,626 A | * | 3/2000 | Cheah et al. ................ 257/735 |
| 6,307,223 B1 | * | 10/2001 | Yu ............................... 257/256 |
| 6,355,513 B1 | * | 3/2002 | Yu ............................... 257/136 |

* cited by examiner

Primary Examiner—David Nelms
Assistant Examiner—Andy Huynh
(74) Attorney, Agent, or Firm—Wagner Murabito & Hao LLP

(57) ABSTRACT

A semiconductor package including a bottom leadframe having a bottom plate portion and a first terminal extending from the bottom plate portion, and a second terminal being co-planar with the first terminal. The semiconductor package also comprises a semiconductor power enhancement mode JFET die having a bottom surface and a top surface on which a first metalized region and a second metalized region are disposed. The bottom surface of the JFET die is coupled to the bottom plate of the leadframe. The semiconductor package also comprises a copper plate coupled to and spanning a substantial part of the first metalized region, and at least one beam portion sized and shaped to couple the copper plate portion to the second terminal such that it is electrically coupled to the source.

21 Claims, 7 Drawing Sheets

SEMICONDUCTOR PACKAGE FOR POWER JFET HAVING COPPER PLATE FOR SOURCE AND RIBBON CONTACT FOR GATE

RELATED APPLICATIONS

The following copending U.S. patent application Ser. No. 09/430,500, "NOVEL JFET STRUCTURE AND MANUFACTURE METHOD FOR LOW ON RESISTANCE AND LOW VOLTAGE APPLICATIONS", Ho-Yuan Yu, Dec. 2, 1999, is incorporated herein by reference for all purposes. The following copending U.S. patent application Ser. No. 09/708,336, "STARTER DEVICE FOR NORMALLY "OFF" JFETS", Ho-Yuan Yu, filed Nov. 7, 2000, is incorporated herein by reference for all purposes.

BACKGROUND OF THE INVENTION

1. Field of the Invention

The present invention is related to a semiconductor package in which a semiconductor die is disposed between upper and lower plate members having outside dimensions of an S08 semiconductor package. The drain of an enhancement mode Junction Field Effect Transistor(JFET) die is electrically coupled to the lower plate member, while the JFET source is coupled to a leadframe via an upper plate member and the JFET gate is electrically coupled to the leadframe via a conductive ribbon.

2. Related Art

With reference to FIG. 1, a semiconductor package 100 according to the prior art is shown. The semiconductor package 100 includes a bottom plate portion 105 and terminals 120, 121. A semiconductor die 130 is disposed on top of the bottom plate portion 105 and fastened thereto, typically using an epoxy material. The semiconductor die 130 includes a metalized region 135 (typically aluminum) defining a connection area for a top surface of the semiconductor die 130. Portions of the terminals 120, 121, bottom plate portion 105, and semiconductor die 130 are encapsulated in a housing 140, typically formed from a moldable material. In order to obtain an electrical connection between the metalized region 135 and the terminal(s) 121, one or more wires 122 are ultrasonically bonded at one end 123 to the metalized region 135 and at a distal end 124 to the terminal 121. One surface of the semiconductor die 130 is coupled to the bottom plate 105 by means of a conductive material 106.

FIG. 2 shows another semiconductor package 200 of the prior art. In order to electrically connect the metalized region 135 with the terminal 121, one or more wires 131 are stitch bonded at locations 132, thereby providing additional paths for current to flow from the semiconductor die 130 to the terminal 121. This marginally reduces the resistance of the current path from the semiconductor die 130 to the terminal 121.

It is desirable to significantly reduce the resistance and inductance of current paths through a power semiconductor package in order to ensure optimum performance of the semiconductor device. Unfortunately, the semiconductor packages of the prior art do not fully achieve this objective because, among other things, the distance D shown in FIG. 1 between one area of the metalized region 135 and the end 123 of the wires 122 increases the resistance of the current path from the metalized region 135 to the terminal 121. This problem is exacerbated when the thickness of the metalized region 135 is relatively small (typically, the thickness is approximately 4 to 8 microns). The relatively thin metalized region 135 in combination with the distance D and the cross sectional profile of the wire bond 122 results in a relatively high resistance and inductance for the current path therethrough.

In some packages (for example S08 packages) the distance D is approximately 80 to 100 mils resulting in a resistance of between about 0.79 and 1.58 mohms for the metalized region 135. The diameters of the wires 122, 131 are approximately 2 mils yielding resistances of about 1.05 mohms (when 14 wires are used). With terminal and epoxy resistances aggregating to about 0.307 mohms, such packages exhibit total resistances of between about 2.14 to 2.93 mohms. The resulting package thermal resistance, RJA, can reach 62.5 degrees Centigrade per Watt.

When the semiconductor package 100 includes, for example, an FET semiconductor die 130, the resistance caused by the distance D and the relatively small diameter of the wires 122, 131 adds to the overall resistance of the FET. Indeed, when die 130 is a FET die, the terminals 120 are typically coupled to the drain of the FET while the terminals 121 are coupled to the source of the FET via one or more wire bonds 122. As ON resistances of FET dies become smaller and smaller, the resistance caused by the distance D and the wire bonds 122, 131 become a larger and larger portion of the overall resistance from one terminal 120 to another terminal 121. Of course, the high frequency performance of a semiconductor device, like an FET, is significantly affected by the resistance and inductance from terminal to terminal through the device.

Some prior art packages have incorporated a large metal strap to obtain an electrical connection between the metalized region 135 and terminal 121. Unfortunately, this technique has only been possible in large semiconductor packages having relatively simple surface structures, such as bipolar junction transistors, diodes, and thyristors. Further, the metal straps were not practical in small outline packages (such as S08, surface mount dual in line packages). The use of a large metal strap in a gated device, such as an FET, has not heretofore been achieved because such devices have relatively complex surface structures. In particular, gated devices typically include a gate runner (or bus), disposed on the surface of the semiconductor die, which traverses the surface such that gate potential is distributed over the surface of the die. Consequently, disposing a large metal strap over the surface of the die has been problematic because the gate runner restricts access to the die surface and could be shorted to the metal strap. Thus, the use of metal straps in gated semiconductor devices has been prohibitive.

Accordingly, there is a need in the art for a new semiconductor package which overcomes the deficiencies in the prior art semiconductor packages by, among other things, reducing the resistances and inductances of the current paths through gated devices such as MOSFETs and JFETs.

SUMMARY OF THE INVENTION

Accordingly, what is needed is a more generally applicable system that will overcome deficiencies of the prior art. One embodiment of the present invention includes a semiconductor package that incorporates a bottom leadframe having a bottom plate portion and at least one first terminal extending from the bottom plate portion; at least one second terminal being co-planar with the first terminal; a semiconductor power enhancement mode JFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a copper plate coupled to and spanning a substantial part of the first metalized region defining the source connection; and at least one beam portion being sized and shaped to couple the copper plate portion to the at least one second terminal such that it is electrically coupled to the source.

DETAILED DESCRIPTION OF THE INVENTION

In the following detailed description of the present invention, semiconductor package for power JFET having copper plate for source and wire bond or ribbon contact for gate, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
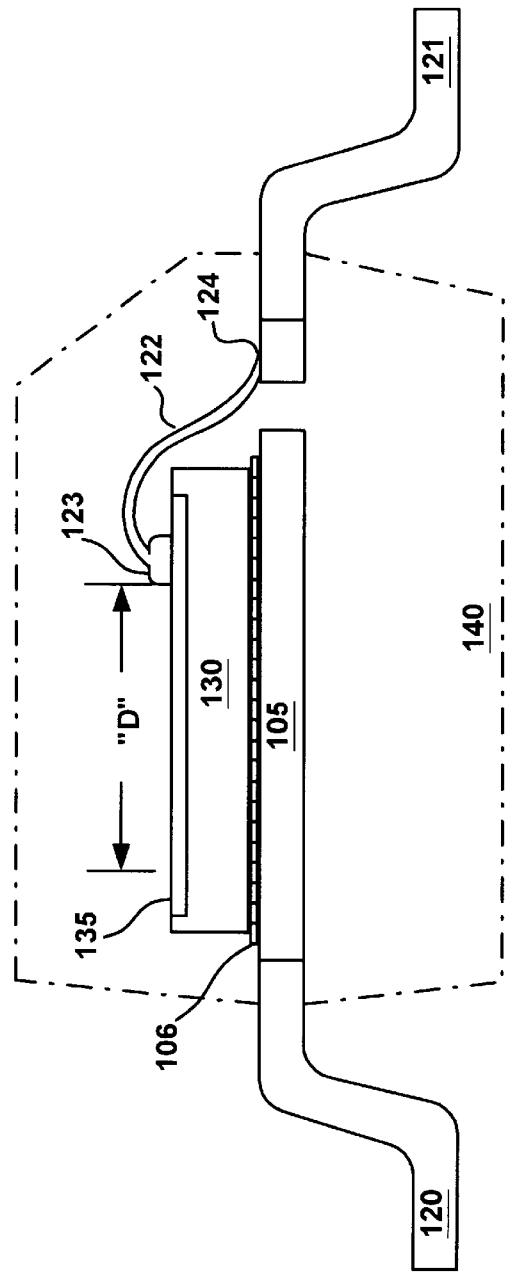
FIG. 1 is a cross-sectional view of a semiconductor package according to the prior art.
Figure 2:
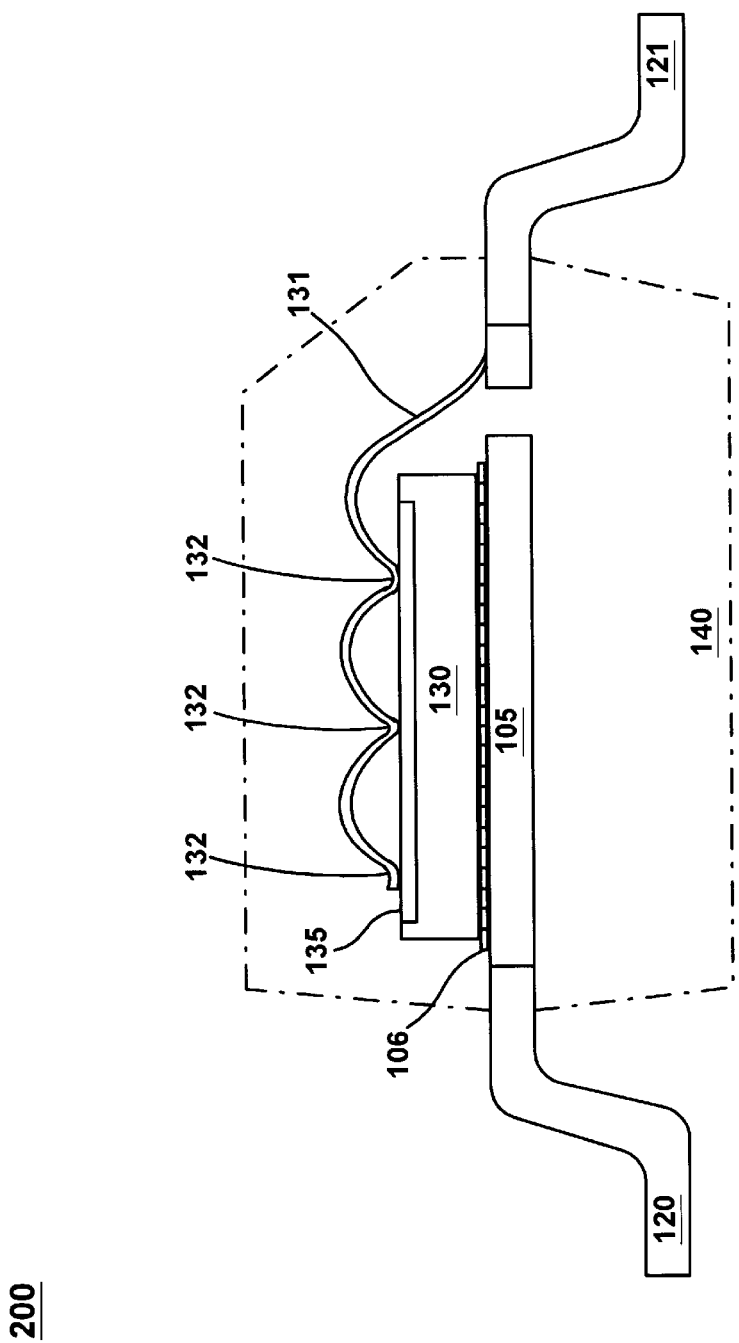
FIG. 2 is a cross-sectional of a semiconductor package according to the prior art.
Figure 3:
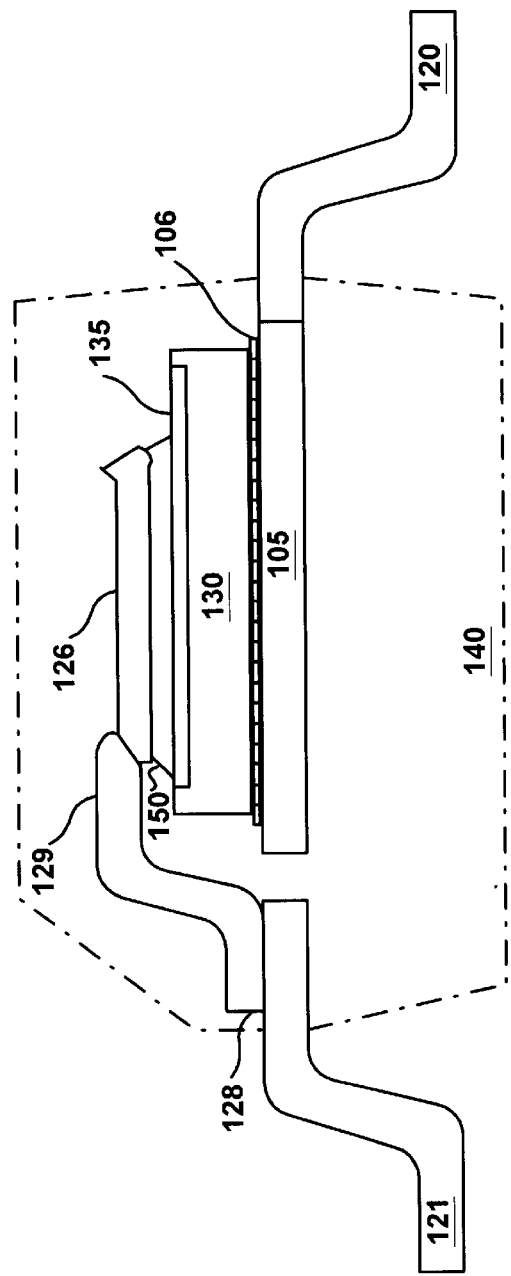
FIG. 3 is a cross-sectional view of a semiconductor package according to the present invention.

Referring now to the drawing wherein like numerals indicate like elements, there is shown in FIG. 3 a cross-sectional view of a semiconductor package 300 in accordance with one aspect of the present invention. The semiconductor package 300 includes a semiconductor die 130 having a bottom surface coupled to a bottom plate 105. The semiconductor die 130 is an enhancement mode JFET die and terminals 120 are electrically coupled to the drain of the JFET die 130. Of course, the semiconductor die 130 may take on other forms, such as diodes, insulated gate bipolar transistors, or the like.

The semiconductor die 130 includes a top surface having a metalized region 135 which defines a connection to the semiconductor die 130. For example, when the semiconductor die 130 is a JFET, metalized region 135 may define a source connection.

The semiconductor package 300 also includes a beam member 129 which is employed to electrically couple the metalized region 135 via the plate member 126 to the terminals 121. The plate portion 126 is preferably formed of copper and spans a substantial portion of the metalized region 135. The beam portion 129 is shaped and sized to couple the plate portion 126 to the terminals 121.

Preferably, the beam portion 129 is coupled, at one end, to a lateral edge of the plate portion 126 and includes a distal end 128 which is coupled to a respective terminal 121. It is to be appreciated that the beam portion 129 and the plate portion 126 may in one embodiment be a single, integral piece.

A curable conductive material 150 (such as silver filled conductive epoxy) is preferably disposed between the lower surface of the plate portion 126 and the metalized region 135 such that the plate 126 is firmly coupled to the metalized region 135. Soft solder may also be used.

It is preferred that the semiconductor package 300 include a housing 140 formed from a moldable material (such as plastic) and that the package configuration conforms to the S08 standard dimensions.

Advantageously, the beam member 129 provides a relatively large contact area for coupling the terminal 121 to the metalized region 135, thereby reducing resistance to current flow and reducing inductance. This provides for improved performance at high frequencies. Further, this structure also enjoys the advantage of providing a thermal path for heat to escape the semiconductor die 130 through the beam member 129.

Figure 4:
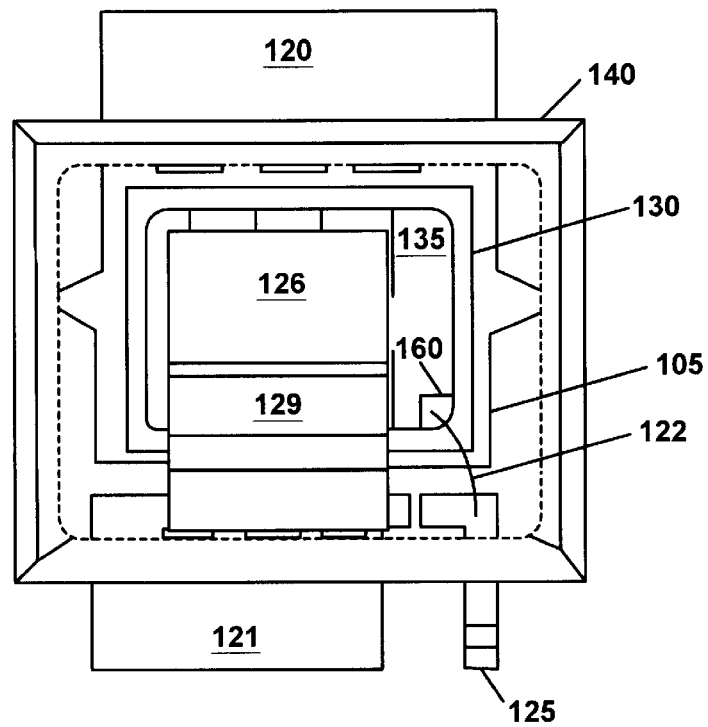
FIG. 4 is a plan view showing terminal connections according to the present invention.

FIG. 4 shows a top plan view of the semiconductor package 400 according to the present invention. The bottom plate 105 is coupled electrically to the drain of the JFET die 130, and it extends to the exterior of the package 140 to form a single, solid lead 120. The drain lead 120 has a width equal to the space occupied by four leads and the spaces between the four leads on a typical S08 package. A single lead of such dimensions greatly reduces both resistance and inductance between the JFET die 130 at the drain contact and the external drain lead 120.

As best seen in FIG. 4, which shows a top plan view of the semiconductor package 400, the beam portion 129 is preferably integrally formed into one flowing member which extends from one lateral edge of the plate portion 126 and terminates at the terminal 121. In the preferred embodiment of the present invention, terminal 121 is a single, solid structure having a width equal to three leads and the spaces between the three leads on one side of an S08 package. A single lead of such dimensions greatly reduces both resistance and inductance between the plate 126 connecting to the source and the external source lead 121. The plate 126 is electrically coupled to the metalized area 135 that serves as the electrical connection to the source on the JFET die 130.

A metalized region 160 defines the gate of the JFET die 130. The metalized region 160 is electrically coupled to one terminal 125 via conductive ribbon 122. Thus, the present invention employs a mixed connection to the JFET die 130 top surface, namely, a low resistance plate portion 126 for connecting to the source and a conductive ribbon 122 for connecting to the gate 160.

Figure 5:
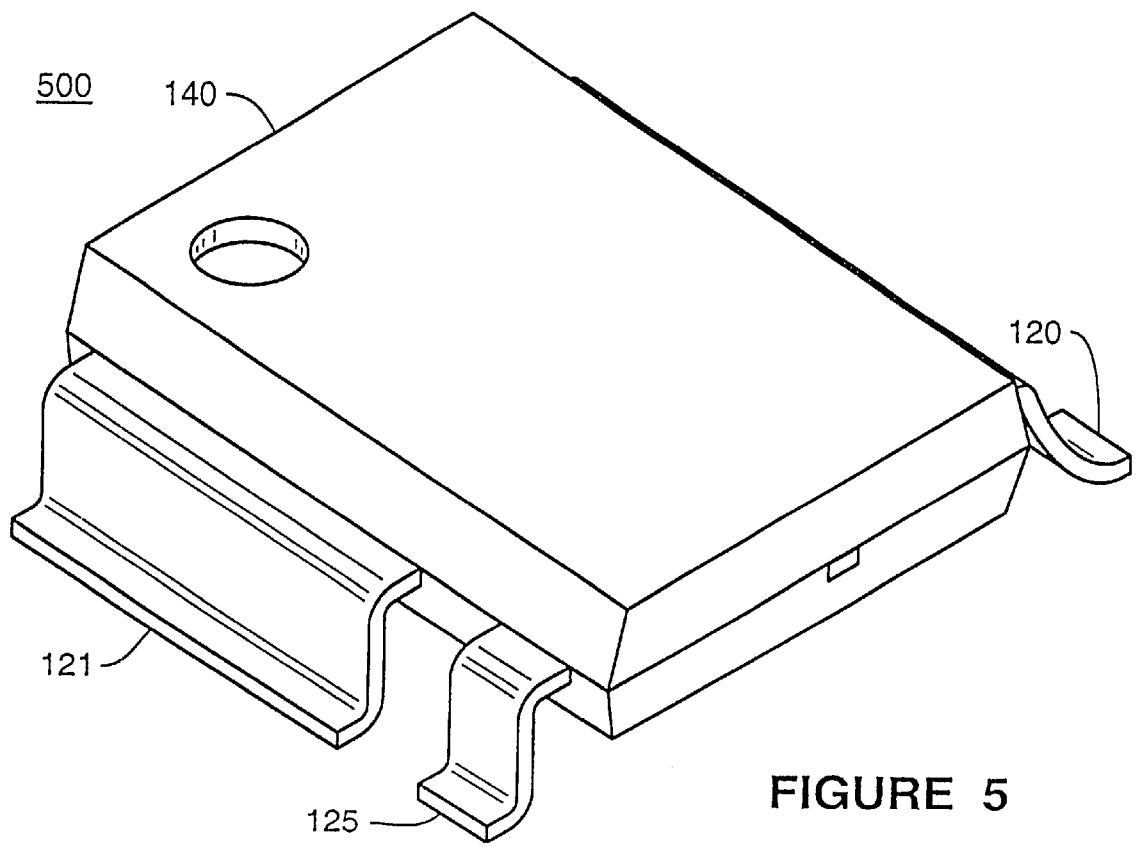
FIG. 5 is a perspective view of an embodiment of the semiconductor package according to the present invention.

FIG. 5 is a perspective view 500 showing the completed package of the present invention. The bottom plate, the JFET die, the top plate and beam connection are entirely enclosed within the moldable package 140. The widest external lead 120 is connected internally to the drain side of the JFET die. The large source lead 121 is seen on the opposite side of the S08 package beside the gate lead 125.

Figure 6:
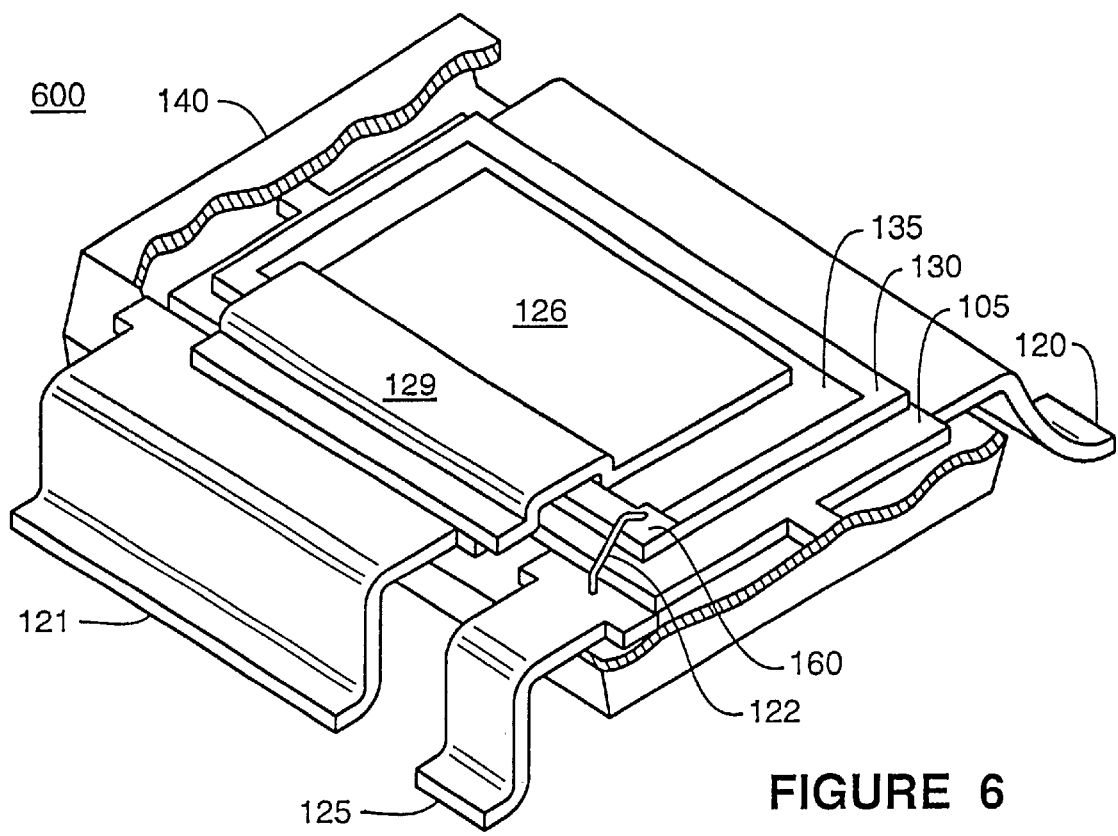
FIG. 6 is a perspective view showing terminal connections according to the present invention.

FIG. 6 is a perspective view 600 showing the completed package of the present invention wherein the top cover of the package 140 is removed to clearly show the interconnections. The bottom plate 105 is connected directly to the external drain lead 120. The JFET die 130 rests directly on the bottom plate with the drain coupled electrically to the bottom plate 05. The metalized area 135 makes electrical connection to the JFET source on the upper surface of the JFET die 130. The plate 126 is electrically coupled to the source metalized area 135. The beam 129 is electrically coupled between the plate 126 and the external pin 121 which is the external source connection. The small metalized area 160 makes electrical connection with the gate lead of the JFET die 130. A conductive ribbon 122 is used to connect the gate to an external pin 125. It is to be appreciated that a wire could be substituted in place of the conductive ribbon.

Figure 7:
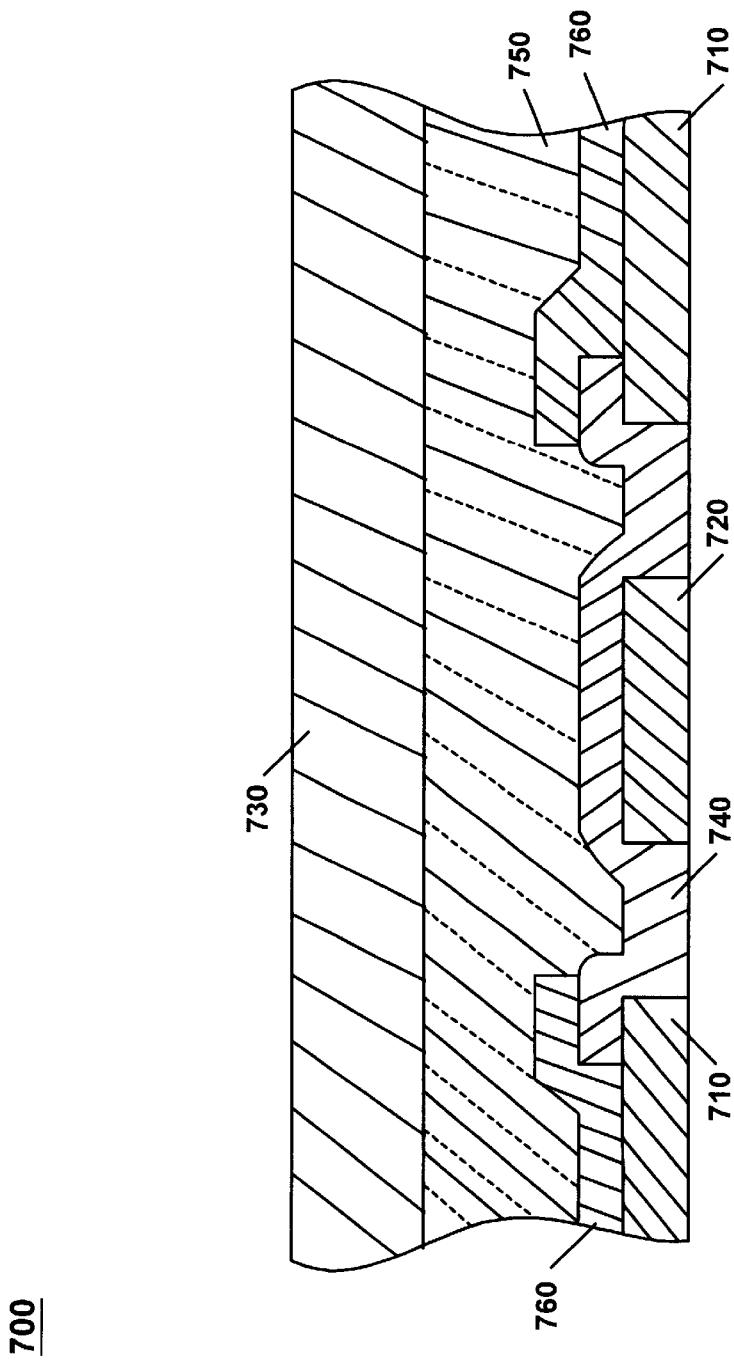
FIG. 7 is a sectional view 700 of the semiconductor package showing isolation of the gate contacts from the source contacts on the surface of the JFET die according to the present invention.

FIG. 7 is a sectional view 700 of the semiconductor package illustrating one method of isolation of the gate contacts from the source contacts which are interlaced over the surface of the JFET die according to the present invention. Two metalized regions 710 represent contacts made with the JFET source, while a single metalized region 720 represents one of the gate contact areas. In order to insulate the gate 720 from the plate portion 730, a nitride layer 740 is disposed on top of the gate 720. The curable conductive material 750 (preferably silver filled epoxy) is disposed on top of a solderable metal 760 and electrically and mechanically couples the plate portion 730 to metalized regions 710. Advantageously, the plate portion 730 is electrically and thermally coupled to the metalized regions 710 without interfering with the gate 720. It is noted that the plate portion 730 may be soldered to the solderable metal 760 if desired. It is preferred, however, that the silver filled epoxy 750 be employed to couple the plate portion 730 to the metalized region 710. When conductive epoxy 750 is employed, it is noted that the solderable metal 760 may be eliminated and the epoxy may directly contact the metalized region 710.

The preferred embodiment of the present invention, semiconductor package for power JFET having copper plate for source and wire bond or ribbon contact for gate, is thus described. While the present invention has been described in particular embodiments, it should be appreciated that the present invention should not be construed as limited by such embodiments, but rather construed according to the below claims.

What is claimed is:

1. A power semiconductor package comprising:
    a bottom leadframe having a bottom plate portion and at least one first terminal extending from said bottom plate portion;
    at least one second terminal being co-planar with said first terminal;
    a third terminal;
    a semiconductor power enhancement mode JFET die having a bottom surface defining a drain connection and a top surface on which a first metalized region defining a source and a second metalized region defining a gate are disposed, said bottom surface being coupled to said bottom plate of said bottom leadframe such that said first terminal is electrically connected to said drain;
    a copper plate coupled to and spanning a substantial part of said first metalized region defining the source connection;
    at least one beam portion being sized and shaped to couple said copper plate portion to said at least one second terminal such that said second terminal is electrically coupled to said source; and
    a conductive ribbon coupling said gate to said third terminal.

2. The power semiconductor package of claim 1, further comprising a layer of curable conductive material disposed between said copper plate and said first metalized region such that said copper plate portion is electrically and mechanically coupled to said source.

3. The power semiconductor package of claim 1, wherein said copper plate includes a top surface and a bottom surface, said bottom surface having downwardly directed projections extending towards said source.

4. The power semiconductor package of claim 1, wherein said JFET die includes a gate bus extending over portions of said source, said copper plate covering substantially all of said gate bus.

5. The power semiconductor package of claim 1, wherein said JFET die includes a gate bus extending over portions of said source, further comprising a nitride layer substantially covering at least a portion of said gate bus, said copper plate being electrically insulated from said gate bus via said nitride layer.

6. The power semiconductor package of claim 5, further comprising a layer of curable conductive material disposed between said copper plate and said source.

7. The power semiconductor package of claim 6, wherein said nitride layer electrically insulates said gate bus from said curable conductive material.

8. The power semiconductor package of claim 1, wherein said package is sized and shaped to conform to an S08 package.

9. The power semiconductor package of claim 8, wherein said first terminal is a solid terminal spanning the full width of four leads and the spaces between four leads on one side of said S08 package.

10. The power semiconductor package of claim 9, wherein said second terminal is a solid terminal spanning a width of three leads and the spaces between three leads on a side of said S08 package opposite to said first terminal.

11. The power semiconductor package of claim 8, wherein said third terminal is a solid terminal spanning a width of a single lead on a side of said S08 package opposite to said first terminal.

12. The power semiconductor package of claim 1, wherein said at least one beam portion extends from a lateral edge of said copper plate and is coupled to said at least one second terminal at a distal end.

13. The power semiconductor package of claim 12, further comprising a layer of curable conductive material disposed between said distal end of said beam portion and said at least one second terminal.

14. The power semiconductor package of claim 12, wherein said at least one second terminal is integral with said at least one beam portion.

15. The power semiconductor package of claim 12, wherein said beam portion is a single member extending from the lateral edge of said copper plate to said at least one second terminal.

16. The power semiconductor package of claim 1 wherein the package includes a plastic housing which substantially encapsulates the bottom leadframe, semiconductor die and copper plate.

17. A power semiconductor package, comprising:
    a bottom leadframe having a bottom plate portion and at least one first terminal extending from said bottom plate portion;
    at least one second terminal being co-planar with said first terminal;
    a semiconductor power enhancement mode JFET die having a top surface on which a first metalized region defining a source and a second metalized region defining a gate are disposed, said top surface further including a gate bus extending over portions of said source, said JFET die further including a bottom surface defining a drain connection coupled to said bottom plate of said leadframe such that said first terminal is electrically connected to said drain;

a nitride layer substantially covering at least a portion of said gate bus;

a layer of curable conductive material disposed atop said nitride layer and said source;

a copper plate coupled to and spanning a substantial part of said source and covering substantially all of said gate bus, said curable conductive material electrically coupling said copper plate to said source but being electrically insulated from said gate bus via said nitride layer;

at least one beam portion being sized and shaped to couple said copper plate portion to said at least one second terminal such that it is electrically coupled to said source; and a conductive ribbon coupling said gate to a third terminal.

18. The power semiconductor package of claim 17, wherein said package is sized and shaped to conform to an S08 package.

19. The power semiconductor package of claim 17, wherein said first terminal is a solid terminal spanning the full width of four leads and the spaces between four leads on one side of said S08 package.

20. The power semiconductor package of claim 17, wherein said second terminal is a solid terminal spanning a width of three leads and the spaces between three leads on a side of said S08 package opposite to said first terminal.

21. The power semiconductor package of claim 17, wherein said third terminal is a solid terminal spanning a width of a single lead on a side of said S08 package opposite to said first terminal.

* * * * *